United States Patent
Zeng et al.

(10) Patent No.: US 10,629,289 B2
(45) Date of Patent: Apr. 21, 2020

(54) SOLID STATE STORAGE DEVICE AND CONTROL METHOD WITH PREDICTION MODEL TO INCREASE READ SPEED

(71) Applicants: Lite-On Electronics (Guangzhou) Limited, Guangzhou (CN); LITE-ON TECHNOLOGY CORPORATION, Taipei (TW)

(72) Inventors: Shih-Jia Zeng, Taipei (TW); Jen-Chien Fu, Taipei (TW); Tsu-Han Lu, Taipei (TW); Kuan-Chun Chen, Taipei (TW)

(73) Assignee: SOLID STATE STORAGE TECHNOLOGY CORPORATION, Taipei (TW)

( * ) Notice: Subject to any disclaimer, the term of this patent is extended or adjusted under 35 U.S.C. 154(b) by 0 days.

(21) Appl. No.: 16/014,200

(22) Filed: Jun. 21, 2018

(65) Prior Publication Data
US 2019/0348143 A1 Nov. 14, 2019

(30) Foreign Application Priority Data
May 9, 2018 (CN) .......................... 2018 1 0467466

(51) Int. Cl.
| | |
|---|---|
| *G06F 11/10* | (2006.01) |
| *G11C 29/52* | (2006.01) |
| *G11C 29/42* | (2006.01) |
| *G06F 11/00* | (2006.01) |
| *G11C 11/56* | (2006.01) |
| *G11C 29/04* | (2006.01) |

(52) U.S. Cl.
CPC ............ *G11C 29/52* (2013.01); *G06F 11/008* (2013.01); *G06F 11/1048* (2013.01); *G11C 11/5642* (2013.01); *G11C 29/42* (2013.01); *G11C 2029/0411* (2013.01)

(58) Field of Classification Search
CPC ..... G11C 29/52; G11C 29/42; G11C 11/5642; G11C 2029/0411; G06F 11/008; G06F 11/1048
See application file for complete search history.

(56) References Cited

U.S. PATENT DOCUMENTS

| | | | | |
|---|---|---|---|---|
| 9,164,832 | B2* | 10/2015 | Gaertner | G06F 11/1008 |
| 9,740,181 | B2* | 8/2017 | Holub | G05B 13/048 |
| 2005/0270855 | A1* | 12/2005 | Earhart | G11B 20/1217 |
| | | | | 365/189.05 |

(Continued)

*Primary Examiner* — Sultana Begum
(74) *Attorney, Agent, or Firm* — WPAT, PC

(57) ABSTRACT

A solid state storage device is in communication with a host. The solid state storage device includes a control circuit and a non-volatile memory. The control circuit is in communication with the host. The control circuit includes an error correction circuit and a prediction model storage circuit. A prediction model is stored in the prediction model storage circuit. The non-volatile memory includes a memory cell array. The memory cell array includes plural blocks. Each of the blocks includes a corresponding state parameter. The control circuit determines a selected block from the memory cell array. The control circuit judges whether to perform a specified operation on the selected block according to the state parameter of the selected block and the prediction model.

10 Claims, 6 Drawing Sheets

(56) References Cited

U.S. PATENT DOCUMENTS

2013/0111108 A1* 5/2013 Chen .................. G06F 12/0246
711/103
2014/0047269 A1* 2/2014 Kim .................. G06F 11/1402
714/16

* cited by examiner

| | Program time (Pt) | Erase time (Et) | Error bit number (Eb) | Read account (Rc) | Decoding process (Dp) |
|---|---|---|---|---|---|
| Block_1 | 1876 | 5980 | 55 | 580 | A |
| Block_2 | 1725 | 6441 | 76 | 89 | A |
| Block_3 | 2034 | 6342 | 102 | 168 | B |
| Block_4 | 1788 | 5983 | 53 | 930 | A |
| ⋮ | | | | | |
| Block_N-1 | 1649 | 7212 | 203 | 541 | C |
| Block_N | 1523 | 7420 | 188 | 776 | C |

| | RR | PEc |
|---|---|---|
| Beginning of life | <0.1% | <10% |
| Middle of life | <5% | <5% |
| End of life | <20% | <1% |

SOLID STATE STORAGE DEVICE AND CONTROL METHOD WITH PREDICTION MODEL TO INCREASE READ SPEED

This application claims the benefit of People's Republic of China Patent Application No. 201810467466.0, filed May 9, 2018, the subject matter of which is incorporated herein by reference.

FIELD OF THE INVENTION

The present invention relates to a solid state storage device and a control method, and more particularly to a solid state storage device and a control method using a prediction model.

BACKGROUND OF THE INVENTION

As is well known, solid state storage devices such as SD cards or solid state drives (SSD) are widely used in various electronic devices.

Generally, a solid state storage device comprises a non-volatile memory. After data are written to the non-volatile memory, if no electric power is supplied to the solid state storage device, the data are still retained in the non-volatile memory.

FIG. 1 is a schematic functional block diagram illustrating a conventional solid state storage device. As shown in FIG. 1, the solid state storage device 10 comprises a control circuit 101 and a non-volatile memory 105. The non-volatile memory 105 further comprises a memory cell array 109. The memory cell array 109 comprises plural memory cells. Generally, the memory cell array 109 is divided into plural blocks, and each block is divided into plural pages.

The solid state storage device 10 is connected with a host 14 through an external bus 12. For example, the external bus 12 is a USB bus, an SATA bus, a PCIe bus, an M.2 bus, a U.2 bus, or the like.

Moreover, the control circuit 101 is connected with the non-volatile memory 105 through an internal bus 113. According to a write command from the host 14, the control circuit 101 stores the write data from the host 14 to the memory cell array 109. Alternatively, according to a read command from the host 14, the control circuit 101 acquires a read data from the memory cell array 109. In addition, the read data is transmitted to the host 14 through the control circuit 101.

Generally, the control circuit 101 stores a default read voltage set. During a read cycle, the control circuit 101 transmits an operation command to the non-volatile memory 105 through the internal bus 113. The control circuit 101 judges the stored data in the memory cell array 109 of the non-volatile memory 105 according to the default read voltage set.

The control circuit 101 further comprises an error correction (ECC) unit 104 for correcting the error bits of the stored data. After the error bits of the stored data are corrected, the read data are correctly read and transmitted to the host 14. However, if the ECC unit 104 is unable to successfully correct all bits of the stored data, the read data is failed to be correctly read and outputted to the host 14. Under this circumstance, the control circuit 101 provides other retry read voltage sets to perform a read retry operation on the non-volatile memory 105.

Depending on the data amount to be stored in the memory cell, the memory cells may be classified into plurality types, i.e. a single-level cell (SLC), a multi-level cell (MLC), a triple-level cell (TLC) and a quad-level cell (QLC). The SLC can store only one bit of data per cell. The MLC can store two bits of data per cell. The TLC can store three bits of data per cell. The QLC can store four bits of data per cell. In other words, the memory cell array 109 can be a SLC memory cell array, a MLC memory cell array, a TLC memory cell array or a QLC memory cell array.

In the memory cell array 109, each memory cell comprises a floating gate transistor. By adjusting the number of hot carriers injected into a floating gate of the floating gate transistor, the storing state of the floating gate transistor is adjusted. In other words, the floating gate transistor of each SLC has two storing states, the floating gate transistor of each MLC has four storing states, the floating gate transistor of each TLC has eight storing states, and the floating gate transistor of each QLC has sixteen storing states.

FIG. 2A schematically illustrates the threshold voltage distribution curves of triple-level cells in different storing states. According to the number of injected hot carriers, the triple-level cell has eight storing states "Erase" and "A"~"G". Before the hot carriers are injected into the memory cell, the memory cell is in a storing state "Erase". As the number of the injected hot carriers increases, the memory cell is sequentially in the other seven storing states "A"~"G". For example, the memory cell in the storing state "G" has the highest threshold voltage, and the memory cell in the storing state "Erase" has the lowest threshold voltage. After an erase cycle, the memory cell is restored to the storing state "Erase", and, ideally, no hot carriers are retained in the memory cell.

In practice, even if many memory cells are in the same storing state during the program cycle, the threshold voltages of these memory cells are not all identical. That is, the threshold voltages of these memory cells are distributed in a specified distribution curve with a median threshold voltage. The median threshold voltage of the memory cells in the storing state "Erase" is Ver. The median threshold voltage of the memory cells in the storing state "A" is Va. The median threshold voltage of the memory cells in the storing state "B" is Vb. The median threshold voltage of the memory cells in the storing state "C" is Vc. The median threshold voltage of the memory cells in the storing state "D" is Vd. The median threshold voltage of the memory cells in the storing state "E" is Ve. The median threshold voltage of the memory cells in the storing state "F" is Vf. The median threshold voltage of the memory cells in the storing state "G" is Vg. For example, the median threshold voltage for a greater number of memory cells in the storing state "A" is Va.

Please refer to FIG. 2A again. According to the above characteristics of the triple-level cell, a default read voltage set including seven read voltages Vra~Vrg is defined. During the read cycle, the control circuit 101 provides the default read voltage set to the non-volatile memory 105 in order to detect the storing states of the triple-level cells of the memory cell array 109.

The storing states of the triple-level cells are determined according to the read voltages Vra~Vrg. For example, the read voltage Vrg is provided from the control circuit 101 to the memory cell array 109. If the threshold voltage of the memory cell is higher than the read voltage Vrg and the memory cell is turned off, the memory cell is judged to be in the storing state "G". Whereas, if the threshold voltage of the memory cell is lower than the read voltage Vrg and the memory cell is turned on, the memory cell is not in the storing state "G". In other words, the eight storing states of the triple-level cells are determined according to the seven read voltages Vra~Vrg of the default read voltage set.

Similarly, four storing states of the multi-level cells are determined according to three read voltages of the default read voltage set. Similarly, two storing states of the single-level cells are determined according to one read voltage of the default read voltage set.

FIG. 2B schematically illustrates the shift of the threshold voltage distribution curves of triple-level cells in different storing states. In some situations such as a cycling condition, a high/room temperature baking condition or a read disturbing condition, the threshold voltage distribution curves of the memory cells of the memory cell array 109 are possibly shifted. Moreover, if the data retention time of the triple-level cells is very long (e.g., over one month), the threshold voltage distribution curves are possibly shifted.

As shown in FIG. 2B, the threshold voltage distribution curves of the triple-level cells are shifted. The median threshold voltage of the memory cells in the storing state "Erase" is Ver'. The median threshold voltage of the memory cells in the storing state "A" is Va'. The median threshold voltage of the memory cells in the storing state "B" is Vb'. The median threshold voltage of the memory cells in the storing state "C" is Vc'. The median threshold voltage of the memory cells in the storing state "D" is Vd'. The median threshold voltage of the memory cells in the storing state "E" is Ve'. The median threshold voltage of the memory cells in the storing state "F" is Vf'. The median threshold voltage of the memory cells in the storing state "G" is Vg'.

If the storing states of the triple-level cells are determined according to the read voltages Vra~Vrg of the default read voltage set, the number of error bits in the read data increases. If the ECC unit 104 is unable to successfully correct all bits of the read data, the read data is failed to be correctly read and outputted to the host 14. Under this circumstance, the control circuit 101 provides another retry read voltage set including the read voltages Vra'~Vrg' to perform the read retry operation.

FIG. 3 is a flowchart illustrating an error correction method for the conventional solid state storage device. During the read cycle, the control circuit 101 performs a decoding process A. In the decoding process A, a hard decoding operation is performed according to the default read voltage set. That is, the control circuit 101 provides the default read voltage set to the non-volatile memory 105, and the ECC circuit 104 performs the hard decoding operation to correct the read data.

If the error bits in the read data can be corrected, it means that the decoding process A passes and the decoding operation is successfully done. Consequently, the read data is correctly read and transmitted from the control circuit 101 to the host 14. Whereas, if the error bits in the read data cannot be corrected, the read data is not correctly read and the decoding process A fails. Then, the control circuit 101 performs a read retry process.

After the control circuit 101 enters the read retry process, a decoding process B is firstly performed. In the decoding process B, a hard decoding operation is performed according to a retry read voltage set. For example, the control circuit 101 provides the retry read voltage set Vra'~Vrg' to the non-volatile memory 105 to acquire the read data. Then, the ECC circuit 104 performs the hard decoding operation to correct the read data. If the error bits in the read data can be corrected, it means that the decoding operation is successfully done to pass the decoding process B. Consequently, the read data is correctly read and transmitted from the control circuit 101 to the host 14. Whereas, if the error bits in the read data cannot be corrected, the read data is not correctly read and the decoding process B fails.

Generally, plural retry read voltage sets (e.g., M retry read voltage sets) have been stored in the control circuit 101. If the decoding operation is successfully done according to one of the plural retry read voltage sets, it means that the decoding process B passes. Whereas, if the data cannot be successfully decoded according to the entire of the M retry read voltage sets, it means that the decoding process B fails. Then, the control circuit 101 performs a decoding process C. Obviously, the time period of performing the decoding process B is longer than the time period of performing the decoding process A.

In the decoding process C, a soft decoding operation is performed according to the retry read voltage set. Generally, the soft decoding operation has better error correction capability than the hard decoding operation. However, while the soft decoding operation is performed, the control circuit 101 acquires one read data according to many retry read voltage sets. In other words, the time period of performing the soft decoding operation is longer. That is, the time period of performing the decoding process C is longer than the time period of performing the decoding process B.

Similarly, if the decoding operation is successfully done by the control circuit 101, it means that the decoding process C passes. Consequently, the read data is correctly read and transmitted from the control circuit 101 to the host 14. Whereas, if the data cannot be successfully decoded by the control circuit 101, it means that the decoding process C fails. Under this circumstance, the control circuit 101 confirms that the read data cannot be correctly read and generates a failed message to the host 14 to indicate that the decoding process fails.

As mentioned above, if the decoding process A fails, the control circuit 101 enters the read retry process. In the read retry process, the control circuit 101 has to perform the decoding process B at first. If the control circuit 101 confirms that the decoding process B fails, the control circuit 101 performs the decoding process C. If the control circuit 101 confirms that the decoding process C fails, the control circuit 101 issues the failed message to the host 14.

If the control circuit 101 cannot acquire the read data in the decoding process A, the control circuit 101 has to enter the read retry process to perform the decoding process B or the decoding process C. However, after the control circuit 101 enters the read retry process, the time period of performing the error correction method of the solid state storage device 10 is very long. Consequently, the read speed of the solid state storage device 10 is largely reduced.

SUMMARY OF THE INVENTION

An embodiment of the present invention provides a solid state storage device. The solid state storage device is in communication with a host. The solid state storage device includes a control circuit and a non-volatile memory. The control circuit is in communication with the host. The control circuit includes an error correction circuit and a prediction model storage circuit. A prediction model is stored in the prediction model storage circuit. The non-volatile memory includes a memory cell array. The memory cell array includes plural blocks. Each of the blocks includes a corresponding state parameter. The control circuit determines a selected block in the memory cell array. The control circuit judges whether to perform a specified operation on the selected block according to the state parameter of the selected block and the prediction model.

Another embodiment of the present invention provides a control method for a solid state storage device. The control method includes the following steps. Firstly, a selected block in a non-volatile memory is determined. Then, a state parameter of the selected block is inputted into a prediction function to obtain a real prediction value. A prediction model for estimating a prediction index contains the prediction function. A threshold prediction value corresponding to a preset target value of the prediction index is obtained according to the prediction model. Then, a judging process is performed to judge whether to perform a specified operation on the selected block according to a relationship between the real prediction value and the threshold prediction value.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention provides a solid state storage device and a control method thereof. Before the solid state storage device leaves the factory, various state parameters of all blocks of a non-volatile memory are collected, and plural prediction models associated with the non-volatile memory are obtained according to a machine learning algorithm. The prediction models are recorded in the solid state storage device. After the solid state storage device leaves the factory, the prediction model is dynamically adjusted according to the current state parameter and the prediction models. Consequently, the non-volatile memory of the solid state storage device has the lower read retry rate and the higher read speed.

Figure 1:
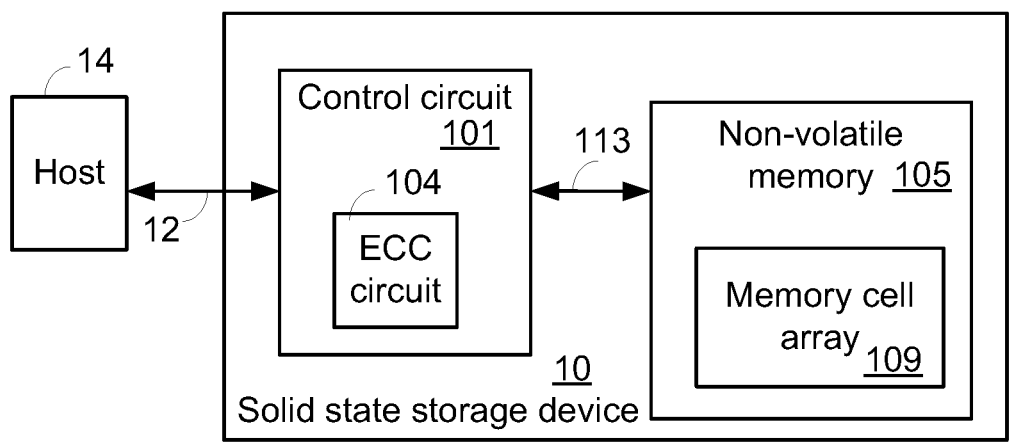
FIG. 1 (prior art) is a schematic functional block diagram illustrating a conventional solid state storage device.
Figure 2A:
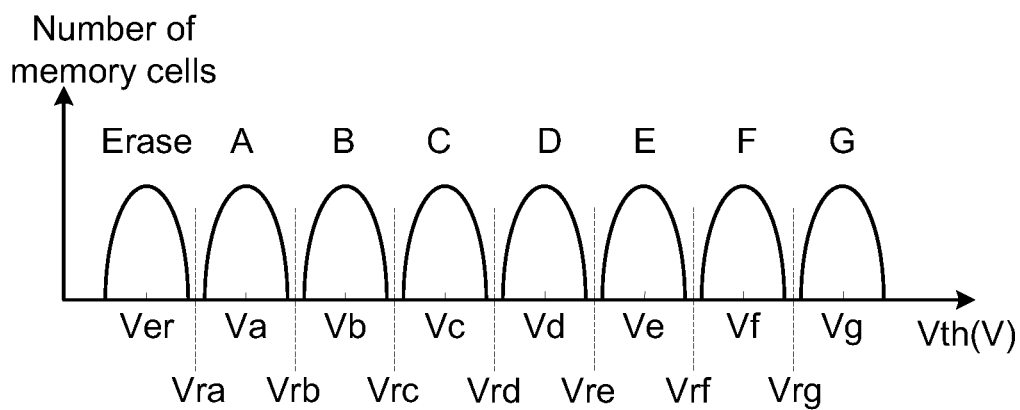
FIG. 2A (prior art) schematically illustrates the threshold voltage distribution curves of triple-level cells in different storing states.
Figure 2B:
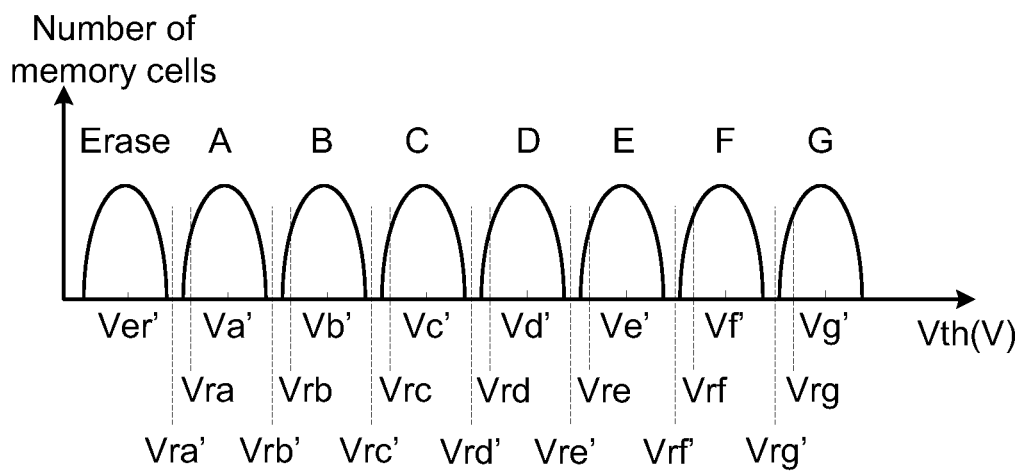
FIG. 2B (prior art) schematically illustrates the shift of the threshold voltage distribution curves of triple-level cells in different storing states.
Figure 3:
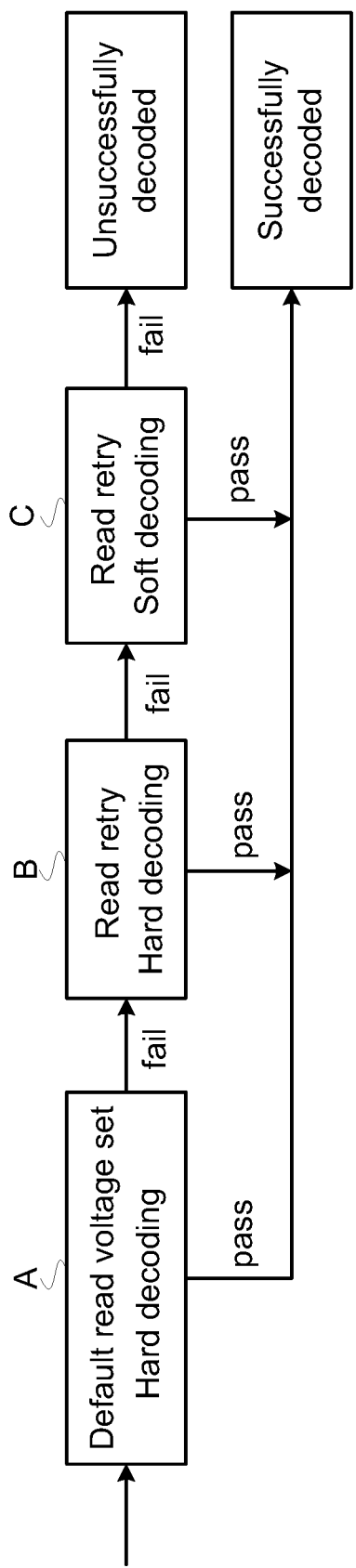
FIG. 3 (prior art) is a flowchart illustrating an error correction method for the conventional solid state storage device.
Figure 4:
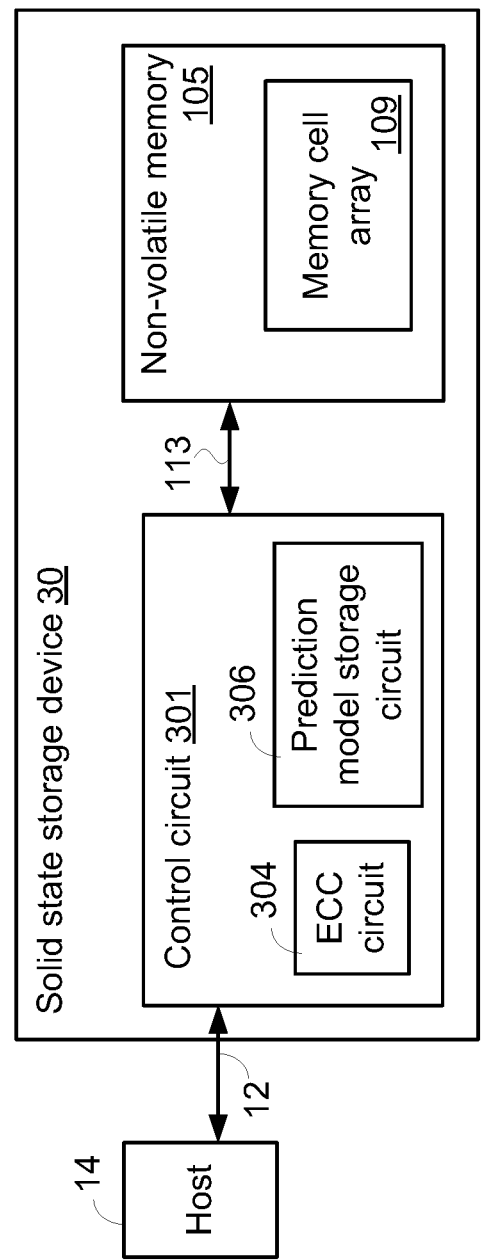
FIG. 4 is a schematic functional block diagram illustrating a solid state storage device according to an embodiment of the present invention.

FIG. 4 is a schematic functional block diagram illustrating a solid state storage device according to an embodiment of the present invention. In comparison with FIG. 1, the control circuit 301 of the solid state storage device comprises an error correction (ECC) circuit 304 and a prediction model storage circuit 306. The ECC unit 304 is used for correcting the error bits of the read data. Moreover, plural prediction models are stored in the prediction model storage circuit 306. A method of establishing and using the prediction models will be described as follows.

After the solid state storage device 30 leaves the factory, if the memory cell array 109 of the non-volatile memory 105 has been read, programmed and erased many times, the performance of the memory cells will be gradually deteriorated. Since the storing states of the memory cells are erroneously judged, the control circuit 301 has to enter the read retry process.

For various conditions of the memory cell array 109 of the non-volatile memory 105, the manufacturer of the solid state storage device 30 collects plural state parameters of all blocks in the memory cell array 109 before the solid state storage device 30 leaves the factory. Moreover, the state parameters are contained in an information table of the non-volatile memory 105 as a database. According to the contents of the information table, the manufacturer acquires plural prediction models. For example, the state parameters include a program count, an erase count, a program time, an erase time, an error bit number, an ambient temperature, a read count, a histogram parameter and a read voltage interval of the corresponding block. The histogram parameter indicates the number of memory cells between two read voltages. The read voltage interval indicates the difference between two read voltages. Moreover, while the information table of the non-volatile memory 105 is established, the decoding process corresponding to each block is used as the state parameter by the control circuit 301.

Figures 5A, 5B:
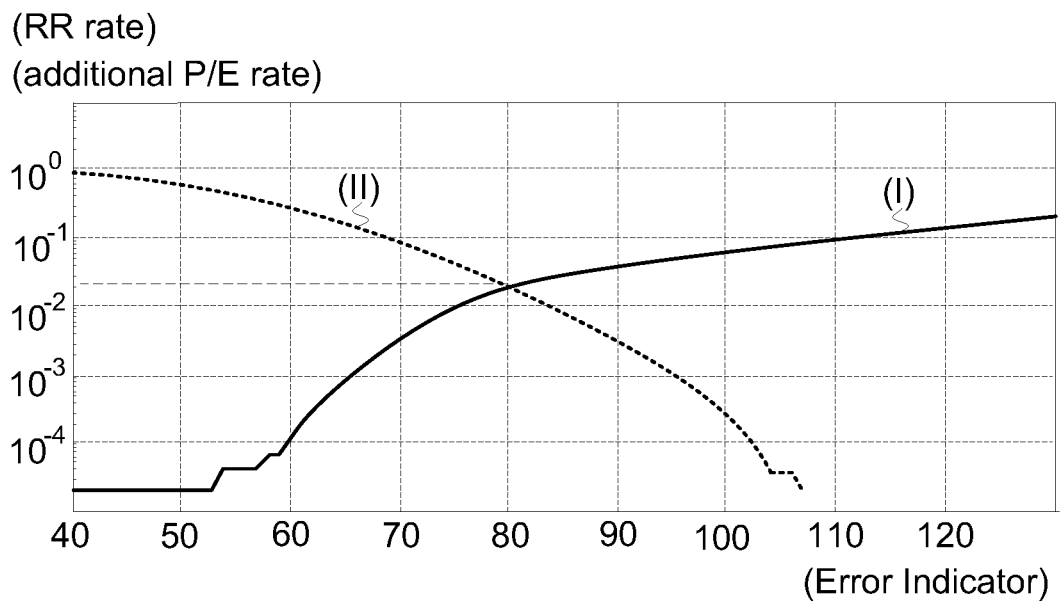
FIG. 5A is an example of the information table of the non-volatile memory according to an embodiment of the present invention.
FIG. 5B is a diagram illustrating the relationships between the error indicator (EI), the read retry rate (RR rate) and the additional program/erase count (additional P/E count)

FIG. 5A is an example of the information table of the non-volatile memory according to an embodiment of the present invention. In FIG. 5A, the state parameters contain the program time (Pt), the erase time (Et), the error bit number (Eb), the read count (Rc) and the decoding process (Dp). It is noted that the items of the state parameters are not restricted. In some embodiments, the state parameters may further contain the program count, the erase count, the ambient temperature, the read count, the histogram parameter and the read voltage interval.

Before the solid state storage device 30 leaves the factory, the manufacturer of the solid state storage device 30 collects the state parameters of N blocks in the non-volatile memory 105. In the information table of FIG. 5A, the state parameters of N blocks are collected. Generally, as the block number N increases, the accuracy of the prediction result increases. In an embodiment, the plural state parameters of several ten thousands of blocks to several million blocks are collected.

For example, the state parameters of the first block (Block_1) indicates that the program time is 1876 μs, the erase time is 5980 μs, the error bit number is 55, the read count is 580 and the decoding process A is the suitable decoding process. Similarly, the control circuit 301 creates the state parameters of other blocks (Block_2~Block_N) by the above method. Consequently, the information table of the non-volatile memory is established.

After the information table of the non-volatile memory is established, the prediction model is searched according to the machine learning algorithm. Before the machine learning algorithm is used to establish the prediction model, a prediction index is defined. Then, the machine learning algorithm is used to obtain a prediction function to establish the prediction model according a great number of parameter data. After the prediction model is established and the state parameters are inputted into the prediction function, a prediction value is obtained. The prediction value is correlated with the prediction index. The prediction model uses the prediction function to express the relationship between the prediction value and the prediction index. In the subsequent application of the prediction model, a target value of the prediction index is set and the prediction value corresponding to the target value is obtained. Then, according to the obtained prediction value, the control circuit determines whether to perform a specified operation.

Take an error prediction model for example. The read retry rate (RR rate) in the next N days is used as the prediction index for determining whether a refresh operation (specified operation) needs to be performed or not. Then, by using the program time (Pt), the erase time (Et), the error bit number (Eb) and the read count (Rc) as the input items, an error prediction function EI(Pt, Et, Eb, Rc) can be acquired according to a linear regression method. Consequently, the error prediction model is established and recoded in the prediction model storage circuit 306.

After the solid state storage device 30 leaves the factory, after inputting the program time (Pt), the erase time (Et), the error bit number (Eb) and the read count (Rc) of the non-volatile memory 105 into the error prediction function EI(Pt, Et, Eb, Rc), an error indicator (EI) can be obtained. The error indicator is also referred as an error prediction value.

In some other embodiments, other state parameters also can be used as the input items. Moreover, the error prediction function also can be acquired by other machine learning algorithms.

In the above embodiment, the read retry rate (RR rate) is used as the prediction index for determining whether a refresh operation needs to be performed. Consequently, the error indicator (EI) is correlated with the read retry rate (RR rate). The error prediction model uses the error prediction function EI(Pt, Et, Eb, Rc) to indicate the relationship between the error indicator (EI) and the read retry rate (RR rate).

FIG. 5B is a diagram illustrating the relationships between the error indicator (EI), the read retry rate (RR rate) and the additional program/erase count (additional P/E count). The relationship between the error indicator (EI) and the read retry rate (RR rate) is shown in the solid curve (I). That is, the RR rate is used as the prediction index of the error prediction model. In an embodiment, the additional P/E count also can be used as the prediction index for determining whether the refresh operation needs to be performed or not. The relationship between the error indicator (EI) and the additional P/E count is shown in the dotted curve (II). That is, the additional P/E count is used as the error prediction model of the prediction index.

In an embodiment, the error prediction function is the function of the program time (Pt), the erase time (Et), the error bit number (Eb) and the read count (Rc). That is, the error prediction function EI(Pt, Et, Eb, Rc)=c1×Pt+c2×Et+c3×Eb+c4×Rc, wherein c1, c2, c3 and c4 are coefficients. It is noted that the way of acquiring the error prediction function EI(Pt, Et, Eb, Rc) is not restricted to the linear regression method. For example, in another embodiment, the error prediction function EI(Pt, Et, Eb, Rc) can be acquired according to a neural network regression method or a decision forest regression method. After the program time (Pt), the erase time (Et), the error bit number (Eb) and the read count (Rc) of the block of the non-volatile memory 105 are inputted into the error prediction function EI(Pt, Et, Eb, Rc), the error indicator (EI) is obtained. The error indicator (EI) indicates the error degree of the block in the future.

After the solid state storage device 30 leaves the factory, the control circuit 301 acquires the error indicator (EI) according to the state parameter in the block of the non-volatile memory 105 and the error prediction function EI(Pt, Et, Eb, Rc), and predicts a future read retry rate (RR rate) according to the relationship between the error indicator (EI) and the read retry rate (RR rate) of the solid curve (I).

For example, if after the program time (Pt), the erase time (Et), the error bit number (Eb) and the read count (Rc) of the block of the non-volatile memory 105 are inputted into the error prediction function EI(Pt, Et, Eb, Rc), the error indicator (EI) is 80. According to the relationship between the error indicator (EI) and the read retry rate (RR rate) of the solid curve (I) as shown in FIG. 5B, the estimated future read retry rate is about 2%.

Figure 5C:
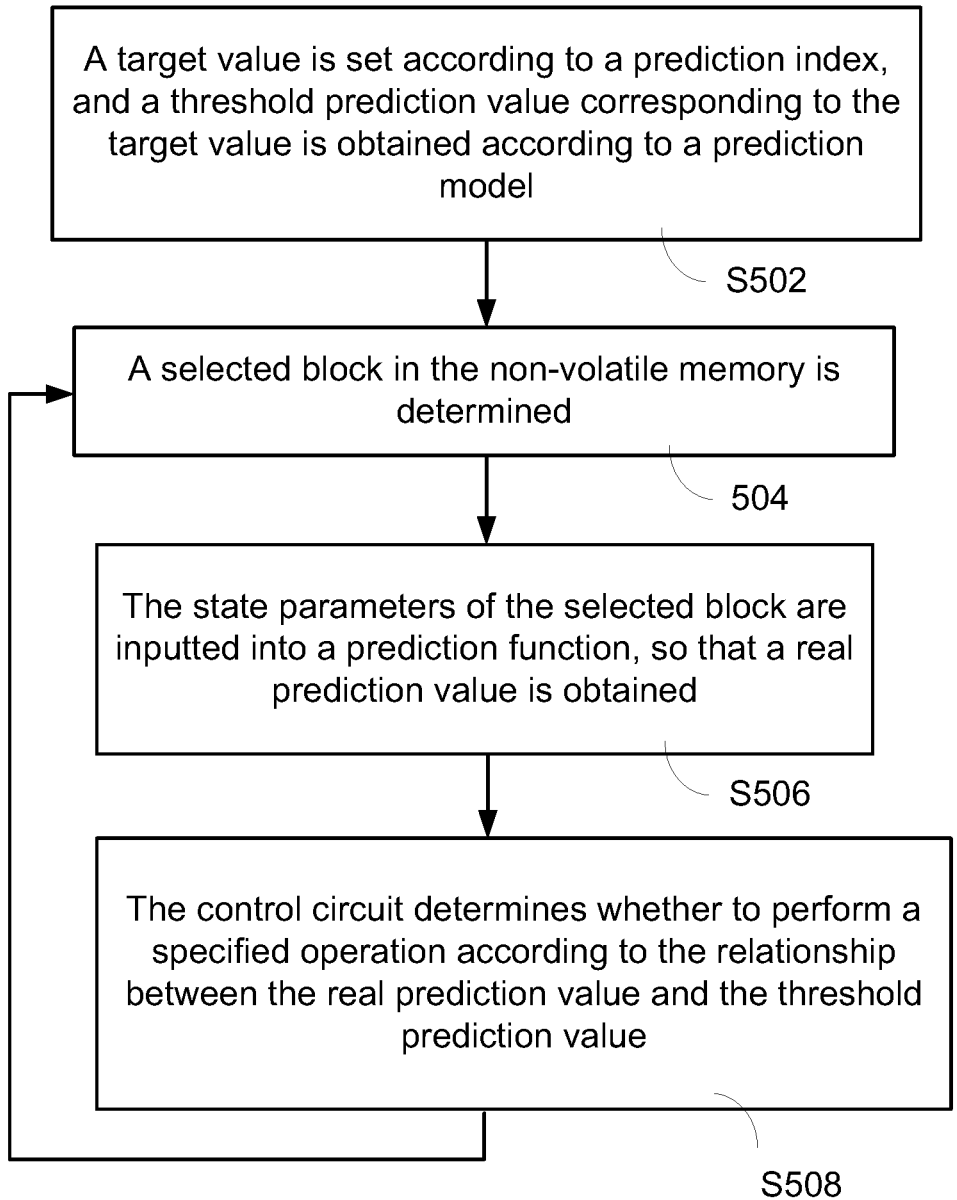
FIG. 5C is a flowchart illustrating a control method of using a prediction model according to an embodiment of the present invention.

FIG. 5C is a flowchart illustrating a control method of using a prediction model according to an embodiment of the present invention. Firstly, in a step S502, a target value is set according to a prediction index, and a threshold prediction value corresponding to the target value is obtained according to a prediction model (e.g., the solid curve I). Then, the control circuit 301 determines a selected block in the non-volatile memory 105 (Step S504). Moreover, valid data are stored in the selected block. Then, the state parameters of the selected block are inputted into a prediction function, so that a real prediction value is obtained (Step S506). In a step S508, the control circuit 301 determines whether to perform a specified operation according to the relationship between the real prediction value and the threshold prediction value.

Figure 6:
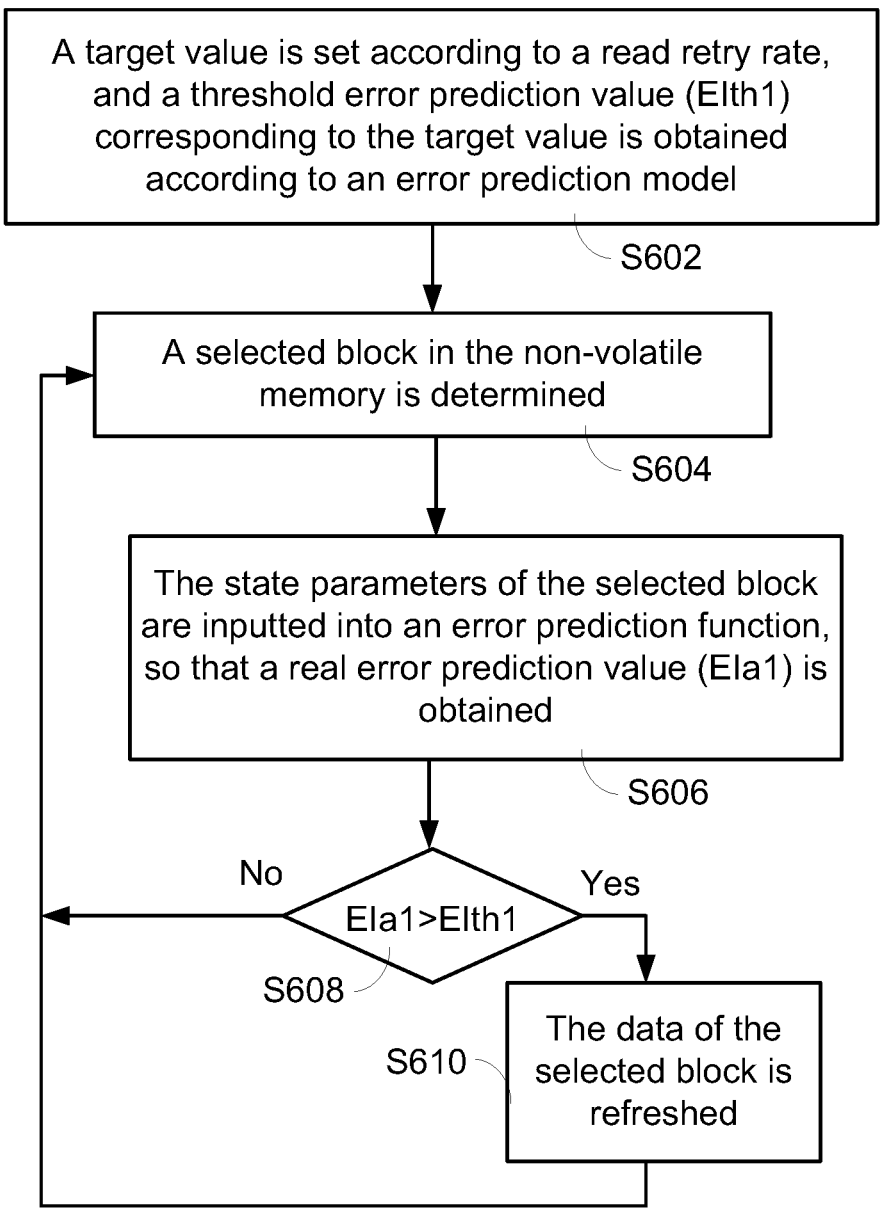
FIG. 6 is a flowchart illustrating a control method of using an error prediction model according to an embodiment of the present invention.

FIG. 6 is a flowchart illustrating a control method of using an error prediction model according to an embodiment of the present invention. Firstly, in a step S602, a target value is set according to a read retry rate, and a threshold error prediction value (EIth1) corresponding to the target value is obtained according to an error prediction model. In this error prediction model, the read retry rate (RR rate) in the next N days is used as the prediction index for determining whether a refresh operation (specified operation) needs to be performed or not. In addition, the read retry rate of the block is set to be lower than 2% under control of the control circuit 301. That is, the target value of the read retry rate is set as 2%. Then, according to the relationship between the error indicator (EI) and the read retry rate (RR rate) of the solid curve (I) as shown in FIG. 5B, the threshold error prediction value (EIth1) is 80. Then, the control circuit 301 determines a selected block in the non-volatile memory 105 (Step S604). Moreover, valid data are stored in the selected block.

Then, the state parameters of the selected block are inputted into an error prediction function, so that a real error prediction value (EIa1) is obtained (Step S606). In the step S608, the control circuit 301 judges whether the real error prediction value (EIa1) is larger than the threshold error prediction value (EIth1). If the real error prediction value (EIa1) is not larger than the threshold error prediction value (EIth1), the control circuit 301 determines that is no need to perform the refresh operation (specified operation) and then the step S604 is repeatedly done. Whereas, if the real error prediction value (EIa1) is larger than the threshold error prediction value (EIth1), the control circuit 301 determines that is need to perform the refresh operation (specified operation), and refreshes the data of the selected block (Step S610) and then the step S604 is repeatedly done. For refreshing the data of the selected block, the data stored in the selected block is moved to a blank block of the non-volatile memory 105.

In an embodiment, the control circuit 301 periodically checks one block of the non-volatile memory 105 at a preset time interval. For example, the preset time interval is 1 minute. It is noted that numerous modifications and alterations may be made while retaining the teachings of the invention. For example, in another embodiment, the preset time interval is not fixed. Alternatively, the control circuit 301 checks one block of the non-volatile memory 105 when the solid state storage device 30 is in an idle state without executing any command. Consequently, the loading of the solid state storage device 30 is reduced.

In case that the real error prediction value (EIa1) is larger than the threshold error prediction value (EIth1), it means that the read retry rate (RR rate) of the selected block in the next N days is possibly larger than 2%. Consequently, the control circuit 301 performs the refresh operation to refresh the data of the selected block. If the real error prediction value (EIa1) is not larger than the threshold error prediction value (EIth1), it means that the read retry rate (RR rate) of the selected block in the next N days is not larger than 2%. Consequently, the control circuit 301 does not perform the refresh operation.

Please refer to FIG. 6. After the refresh operation is completed, the data in the selected block is moved to the new block of the non-volatile memory 105. In other words, after the data is written into the new block, the read retry rate of reading the data by the control circuit 301 is largely reduced. Due to the above control method and the refresh operation, the read retry rate of the non-volatile memory 105 is maintained to comply with the target value of the prediction index. Consequently, the solid state storage device 30 is maintained at the high read speed.

Generally, after the prediction model is established according to the control method of the present invention, the prediction function is not changed. Similarly, after the threshold prediction value corresponding to the target value is obtained, the target value and the threshold prediction value are not changed. In other words, after the solid state storage device 30 leaves the factory, the control circuit 301 performs the subsequent operation according to the preset prediction model. However, the stage of life of the solid state storage device 30 after leaving the factory, the use frequency of the solid state storage device 30, the use condition of the solid state storage device 30 and some factors may influence the prediction result of the preset prediction model. Consequently, the prediction result of the preset prediction model is possibly erroneous, or the prediction result of the preset prediction model is unsatisfied. The present invention provides a method for dynamically adjusting the prediction model.

In an embodiment, the target value of the prediction model is dynamically adjusted according to the condition of the solid state storage device 30 (e.g., the stage of life of the solid state storage device 30 after leaving the factory, the use frequency of the solid state storage device 30, the use condition of the solid state storage device 30).

Figures 7, 8:
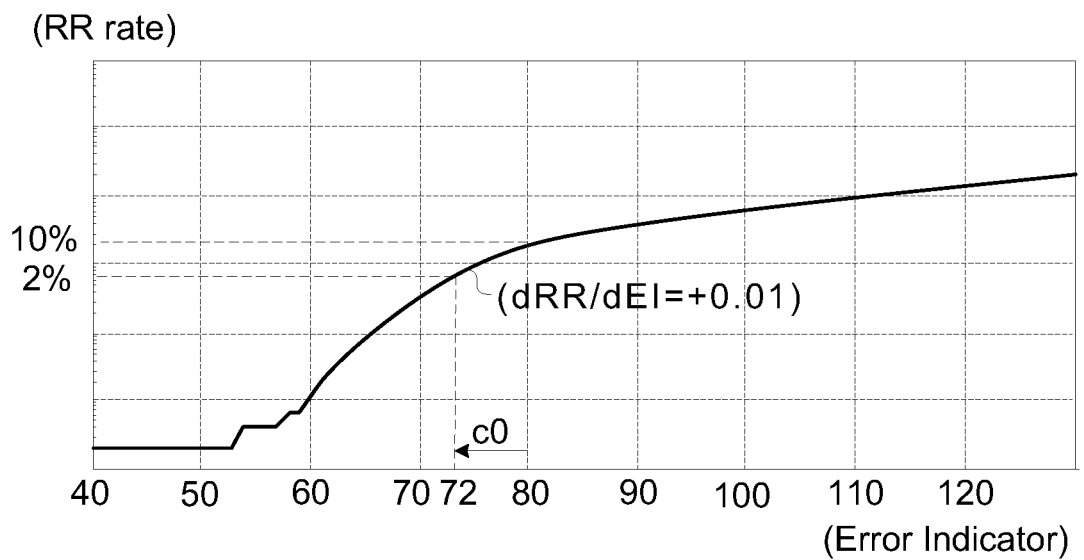
FIG. 7 is a table illustrating the target values to be dynamically adjusted according to the stage of life of the solid state storage device after leaving the factory.
FIG. 8 is a diagram illustrating a method of correcting the compensation value of the error prediction function according to an embodiment of the present invention.

FIG. 7 is a table illustrating the target values to be dynamically adjusted according to the stage of life of the solid state storage device after leaving the factory.

In the beginning of life of the solid state storage device 30 after leaving the factory, the block of the non-volatile memory 105 has the lower read retry rate (RR) and the higher additional P/E count (PEc) because the characteristics of the solid state storage device 30 are still satisfactory. Under this circumstance, the lower read retry rate or the higher additional P/E count is set as the target value. That is, the lower read retry rate or the higher additional P/E count is used as the target value of the prediction index for determining whether the refresh operation needs to be performed or not. For example, if the read retry rate (RR) is lower than 0.1% and/or the additional P/E count (PEc) is lower than 10%, the refresh operation needs to be performed. Since the unnecessary refresh operation is avoided, the solid state storage device 30 is operated at the high read speed.

In the middle of life of the solid state storage device 30 after leaving the factory (e.g., after 2 years), the characteristics of the block of the non-volatile memory 105 are gradually deteriorated. Under this circumstance, the target value corresponding to the read retry rate is increased, or the target value corresponding to the additional P/E count is decreased. For example, if the read retry rate (RR) is lower than 5% and/or the additional P/E count (PEc) is lower than 5%, the refresh operation needs to be performed.

In the end of life of the solid state storage device 30 after leaving the factory (e.g., after many years), the characteristics of the block of the non-volatile memory 105 are largely deteriorated. Meanwhile, the read retry rate (RR) of the block is very low, and the additional P/E count (PEc) is very high. Under this circumstance, the target value corresponding to the read retry rate is continuously increased, or the target value corresponding to the additional P/E count is continuously decreased. For example, if the read retry rate (RR) is lower than 20% and/or the additional P/E count (PEc) is lower than 1%, the refresh operation needs to be performed.

As mentioned above, the prediction model is used for judging whether to perform the specified operation according to the target value corresponding to the condition of the solid state storage device 30. According to the real condition of the solid state storage device 30, the prediction model can judge whether to perform the specified operation. Consequently, the life of the solid state storage device 30 is effectively extended since the unnecessary refresh operation is avoided.

As mentioned above, the target value of the prediction model is dynamically adjusted according to the condition of the solid state storage device 30. In another embodiment, the present invention provides a method for dynamically adjusting the prediction function of the prediction model. In case that the prediction result of the prediction model is erroneous, a compensation value is added to the prediction function to dynamically adjust the prediction model. Consequently, the accuracy of the prediction result of the prediction model is enhanced.

Take the error prediction function EI(Pt, Et, Eb, Rc) of FIG. 5B as example. In this example, the threshold error prediction value (EIth1) is set as 80 by the control circuit 301. According to the solid curve (I) as shown in FIG. 5B, the corresponding preset read retry rate (RRp) is 2%. That is, the target value of the read retry rate is set as 2%. In case that the control method of the present invention is applied to the error prediction model, the read retry rate of the non-volatile memory 105 is controlled to be lower than 2%.

However, due to the process variation of the non-volatile memory 105 or the deviation of the operating environment, the preset error prediction model is possibly shifted. That is, even if the error prediction value is identical, the real read retry rate of the non-volatile memory 105 may not comply with the preset read retry rate. For example, the error prediction value is 80, but the real read retry rate of the non-volatile memory 105 is larger than 2%. For solving this drawback and increasing the accuracy of the error prediction model, the error prediction function EI(Pt, Et, Eb, Rc) needs to be modified.

In an embodiment, the error prediction function EI(Pt, Et, Eb, Rc) is modified to have the formula: $c1 \times Pt + c2 \times Et + c3 \times Eb + c4 \times Rc + c0$, wherein c1, c2, c3 and c4 are coefficients and c0 is a compensation value. When the solid state storage device 30 leaves the factory, the compensation value c0 is set as 0.

FIG. 8 is a diagram illustrating a method of correcting the compensation value of the error prediction function according to an embodiment of the present invention. After the solid state storage device 30 has been operated for a certain time period, if the control circuit 301 calculates the real read retry rate of the block is 10% under the error prediction value is 80. That is, the real read retry rate does not comply with the preset read retry rate (e.g., 2%), and the prediction result of the preset prediction model is unsatisfied. Consequently, the control circuit 301 has to modify the compensation value c0 of the error prediction function.

In case that the threshold error prediction value (EIth1) is 80, the real read retry rate of the non-volatile memory 105 is 10%. That is, the difference between the real read retry rate of the non-volatile memory 105 and the preset read retry rate (RRp) is −8% (i.e., 2% −10%=−8%). In case that the read retry rate is used as the prediction index of the error prediction model, the slop (dRR/dEI) corresponding to the threshold error prediction value and the preset read retry rate is +0.01. In other words, the relationship between the threshold error prediction value and the preset read retry rate of the error prediction model in this example is negatively shifted. That is, the shift value is −8. For compensating the shift value, the compensation value c0 calculated by the control circuit 301 is +8. Consequently, the error prediction function EI(Pt, Et, Eb, Rc) is modified to have the formula: $c1 \times Pt + c2 \times Et + c3 \times Eb + c4 \times Rc + 8$. Since the error prediction function is modified through the compensation value c0, the read retry rate corresponding to the error prediction value of 80 is restored to the original preset read retry rate (e.g., 2%). After the solid state storage device 30 performs the operation according to the error prediction model, the read retry rate of the solid state storage device 30 is restored to comply with the original preset read retry rate (e.g., 2%).

In the above embodiment, the compensation value is added to the prediction function to dynamically adjust the prediction model. In another embodiment, the compensation value is added to the threshold error prediction value. The compensation values of the two embodiments are distinguished in the positive and negative signs. In case that the threshold error prediction value (EIth1) is 80 and the real read retry rate of the non-volatile memory 105 is 10%, the preset read retry rate (RRp) is 2%. After calculation, the relationship between the threshold error prediction value and the preset read retry rate of the error prediction model in this example is negatively shifted. That is, the shift value is −8. In this embodiment, the compensation value is −8. Meanwhile, the threshold error prediction value is changed from 80 to 72.

As mentioned above, the present invention provides a method of dynamically adjusting the prediction model. According to the settings of the solid state storage device 30, the control circuit 301 judges whether the real target value complies with the preset target value after the solid state storage device 30 has been operated for a certain time period (e.g., after 7 days or one week or after ten thousands of read cycles). If the real target value does not comply with the preset target value, the prediction model is dynamically adjusted.

For example, the read retry rate is used as the prediction index of the error prediction model. According to the settings of the solid state storage device 30, the control circuit 301 judges whether the real read retry rate complies with the preset read retry rate after the solid state storage device 30 has been operated for a certain time period (e.g., after 7 days or one week or after ten thousands of read cycles). If the real read retry rate does not comply with the preset read retry rate, the error prediction model is dynamically adjusted. Consequently, the read retry rate complies with the preset read retry rate.

From the above descriptions, the present invention provides a solid state storage device and a control method of the solid state storage device. A prediction model is stored in the solid state storage device. The prediction model can be dynamically adjusted. Consequently, the read speed of the solid state storage device is maintained, and the life of the solid state storage device is effectively extended.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A solid state storage device in communication with a host, the solid state storage device comprising:
   a control circuit in communication with the host, wherein the control circuit comprises an error correction circuit and a prediction model storage circuit, wherein a prediction model is stored in the prediction model storage circuit; and
   a non-volatile memory comprising a memory cell array, wherein the memory cell array comprises plural blocks, and each of the blocks comprises a corresponding state parameter;
   wherein the prediction model contains a prediction function, and a threshold prediction value corresponding to a preset target value is obtained according to the prediction model;
   wherein after the state parameter of a selected block is inputted into the prediction function, a real prediction value is obtained; and
   wherein if a real target value of the non-volatile memory does not comply with the preset target value, the control circuit dynamically adjusts the prediction model by correcting a compensation value of the prediction function;

wherein the prediction model is an error prediction model, the prediction function is an error prediction function, the threshold prediction value is a threshold error prediction value, and the preset target value is a preset read retry rate; and wherein if a real read retry rate of the non-volatile memory does not comply with the preset read retry rate, the control circuit corrects a compensation value of the error prediction function.

2. The solid state storage device as claimed in claim 1, wherein the prediction model is an error prediction model, the prediction function is an error prediction function, the threshold prediction value is a threshold error prediction value, and the preset target value is a preset read retry rate,
wherein the control circuit judges whether to perform a refresh operation on the selected block according to a result of comparing the real prediction value with the threshold prediction value.

3. The solid state storage device as claimed in claim 1, wherein the compensation value is determined according to the real read retry rate, the preset read retry rate and the threshold error prediction value.

4. The solid state storage device as claimed in claim 2, wherein if the real prediction value is larger than the threshold prediction value, the control circuit refreshes a data of the selected block.

5. The solid state storage device as claimed in claim 1, wherein the preset read retry rate is lower than a first value in the beginning of life of the solid state storage device, the preset read retry rate is lower than a second value in the middle of life of the solid state storage device, and the preset read retry rate is lower than a third value in the end of life of the solid state storage device, wherein the first value is lower than the second value, and the second value is lower than the third value.

6. A control method for a solid state storage device, the control method comprising steps of:
determining a selected block in a non-volatile memory;
inputting a state parameter of the selected block into a prediction function to obtain a real prediction value, wherein a prediction model for estimating a prediction index contains the prediction function, and a threshold prediction value corresponding to a preset target value of the prediction index is obtained according to the prediction model;
judging whether to perform a specified operation on the selected block according to a relationship between the real prediction value and the threshold prediction value; and
correcting a compensation value of the prediction function if a real target value of the non-volatile memory does not comply with the preset target value;
wherein the prediction index is a read retry rate, the prediction function is an error prediction function, the threshold prediction value is a threshold error prediction value, the real prediction value is a real error prediction value, the prediction model is an error prediction model, the error prediction model indicates a relationship between the error prediction function and the read retry rate, and the error prediction function is a function of the state parameter.

7. The control method as claimed in claim 6, wherein if the real error prediction value is larger than the threshold error prediction value, the control method further comprises a step of refreshing a data of the selected block, so that the read retry rate of the non-volatile memory is lower than a preset read retry rate.

8. The control method as claimed in claim 7, wherein if a real read retry rate of the non-volatile memory does not comply with the preset read retry rate, the control method further comprises a step of modifying a compensation value of the error prediction function.

9. The control method as claimed in claim 8, wherein the compensation value is determined according to the real read retry rate, the preset read retry rate and the threshold error prediction value.

10. The control method as claimed in claim 7, wherein after the data in the selected block is stored into a blank block, the data of the selected block is refreshed.

* * * * *